(12) United States Patent
Wile

(10) Patent No.: US 8,710,814 B1
(45) Date of Patent: Apr. 29, 2014

(54) SYSTEMS AND METHODS FOR SWITCHING SUPPLY LOAD CURRENT ESTIMATION

(75) Inventor: Donald Wile, San Jose, CA (US)

(73) Assignee: Adaptive Digital Power, Inc., San Jose, CA (US)

( * ) Notice: Subject to any disclaimer, the term of this patent is extended or adjusted under 35 U.S.C. 154(b) by 316 days.

(21) Appl. No.: 12/889,141

(22) Filed: Sep. 23, 2010

Related U.S. Application Data

(60) Provisional application No. 61/278,107, filed on Oct. 5, 2009, provisional application No. 61/278,108, filed on Oct. 5, 2009, provisional application No. 61/278,109, filed on Oct. 5, 2009, provisional application No. 61/278,127, filed on Oct. 5, 2009, provisional application No. 61/278,128, filed on Oct. 5, 2009, provisional application No. 61/278,129, filed on Oct. 5, 2009.

(51) Int. Cl.
*G05F 1/00* (2006.01)

(52) U.S. Cl.
USPC .......................................... 323/282

(58) Field of Classification Search
USPC ........................................ 323/280, 282–285
See application file for complete search history.

(56) References Cited

U.S. PATENT DOCUMENTS

| | | | |
|---|---|---|---|
| 6,310,469 B1 | 10/2001 | Bentolila et al. | |
| 7,061,213 B2 | 6/2006 | Yoshida | |
| 7,173,403 B1 | 2/2007 | Chen et al. | |
| 7,675,276 B2 | 3/2010 | Ohkawa et al. | |
| 2004/0189351 A1* | 9/2004 | Tai et al. | 327/77 |
| 2005/0057238 A1 | 3/2005 | Yoshida | |
| 2006/0226820 A1* | 10/2006 | Farkas | 323/276 |
| 2007/0040657 A1* | 2/2007 | Fosler et al. | 340/333 |
| 2008/0007222 A1* | 1/2008 | Nance et al. | 320/128 |
| 2008/0130325 A1 | 6/2008 | Ye | |
| 2009/0079410 A1 | 3/2009 | Ohkawa et al. | |
| 2009/0096489 A1* | 4/2009 | Ying et al. | 327/103 |
| 2009/0102444 A1 | 4/2009 | Nonaka | |
| 2009/0315523 A1 | 12/2009 | Kumagai et al. | |
| 2010/0066328 A1 | 3/2010 | Shimizu et al. | |
| 2010/0102788 A1 | 4/2010 | Kuroyabu et al. | |

* cited by examiner

*Primary Examiner* — Jue Zhang
(74) *Attorney, Agent, or Firm* — Tran & Associates

(57) ABSTRACT

Systems and methods are disclosed to detect a load current in a power regulator by providing power output through power transistors each having a plurality of dead time periods during break-before-make (BBM) of the power transistors; and measuring the load current of the output power circuit during the dead time period.

20 Claims, 10 Drawing Sheets

SYSTEMS AND METHODS FOR SWITCHING SUPPLY LOAD CURRENT ESTIMATION

This application claims priority to U.S. Provisional Application Ser. Nos. 61/278,107; 61/278,108; 61/278,109; 61/278,127; 61/278,128; and 61/278,129, all of which were filed on Oct. 5, 2009, the contents of which are incorporated by reference.

BACKGROUND

The present invention relates to systems and methods for estimating switching supply load current.

The capability to dynamically measure the power consumption of an electronic system is highly desirable. Some of the benefits include: system fault detection (should power exceed a normal range), engineering power savings (during system prototype development), ability to provide accurate battery life estimates (in a battery operated system). Today's modern electronic systems often utilize switching regulators in order to improve the system power efficiency and reduce heat. In applications where large amounts of current are required, external power field effect transistors (FETs) (as opposed to power FETs integrated with the switching regulator) are most economical. One aspect of power estimation requires measuring the output current supplied by these external FETs.

Previous solutions to measuring the output current flowing in external FETs, utilize a sense resistor in series with the output, wherein the voltage drop across the resistor was proportional to the output current. In this circumstance, the output current is measured by sensing this resistor voltage drop. This method works at the expense of lower efficiency, as any voltage across the sense resistor results in a power loss and resulting degradation in the regulator efficiency. Consequently, in order to minimize the power loss, the sense resistor value is kept small which results in poor resolution of low current measurements (due to the low resulting voltage drop across the sense resistor). Also, low value resistors are expensive.

An alternate method for measuring the output current requires the use of specialized output inductors. Most switching regulators utilize external inductors as part of the voltage transformation/regulation loop. It is possible to add a separate set of "turns" around the output inductor which sense the magnitude of the magnetic flux in the inductor. The magnitude of the magnetic flux is proportional to the current in the inductor. Thus, the extra turns provide a means to sense the current flow in the output inductor. While this method does not suffer the efficiency loss of the sense resistor method, it does require the use of a more expensive and non-standard output inductor.

FIG. 1 shows a typical BUCK regulator output power stage. In this regulator design, supply voltage 6 provides power to output power FET Q2 16, which is controlled by "Break Before Make" (BBM) unit 12. Output FET Q2 16 is also connected to output FET Q1 20. Body diodes D1 22 and D2 18 are built into the output power FETs Q1 20 and Q2 16. "FET Control" circuit 10 (shown as a voltage source) generates a switching signal to command the power FETs to turn on and off. BBM units 12-14 insure that under no circumstances are both power FETs 16 and 20 on at the same time, which would cause a large "shoot though" current to flow in the FETs 16 and 20. Thus, for example, if Q2 16 is on and Q1 20 are off then the BBMs 12 and 14 insure that Q2 16 is shut off before Q1 20 is turned on. Because of the BBMs 12 and 14, there is a short period of time, perhaps 20 ns or more, (called the "dead time") when neither Q1 20 nor Q2 16 is turned on.

The physics of inductor 26 do not allow for instantaneous changes in the current flowing through the inductor. Thus if the power output stage is sourcing current to the load Rload 30 and capacitor C1 28, then even during the short dead time, when both Q1 20 and Q2 16 are off, the load current will continue to flow through inductor 26. During this period of time, the body diode D1 22 will source the current from ground through inductor 26 to the load. When body diode D1 22 is conducting current, the voltage at the PowerSwitch_out 24 will go below ground.

SUMMARY

In a first aspect, systems and methods are disclosed to detect a load current in a power regulator by providing power output through power transistors each having a plurality of dead time periods during break-before-make (BBM) of the power transistors; and measuring the load current of the output power circuit during the dead time period.

In a second aspect, a power regulator includes an output power circuit having a plurality of dead time periods; a load current detector coupled to the output power circuit to measure a load current of the output power circuit during the dead time period; and a controller to turn off the output power circuit during the dead time periods.

Implementations of the above aspects may include the following. The controller can have first and second break before make (BBM) circuits. First and second power transistors can be connected to the first and second BBM circuits, respectively. A body diode can be connected to each of the first and second power transistors. An AND gate can be connected to the BBM circuits, and a switch can connected the AND gate output to the output power circuit. A current mirror circuit can be connected to the output power circuit. The current mirror circuit can have a third transistor coupled to the output power circuit and a fourth transistor coupled to the third transistor, wherein the fourth transistor is a fraction of the size of the third transistor. A filter can be connected to the current mirror circuit. The filter can be a capacitor in parallel with a resistor. The load current detector can be in an integrated circuit and wherein the output power circuit comprises one or more power transistors external to the integrated circuit. The load current detector measures current on a periodic basis to maintain high switching regulator efficiency. The load current detector can use the inductive current to measure the load current. The load can include an inductor and the load current detector measures an inductor current for a period of time and a scaled version of the inductor current to generate a voltage proportional to the inductor current. A circuit can be connected to the load current detector to provide over current detection and protection.

Advantages of the preferred embodiments may include one or more of the following. The system supports the ability to perform Current Measure for Over Current Detection. Quickly detecting and protecting against large load currents is important in order to prevent destruction of components. Large load currents might result, for example, if the regulator load is shorted. With minimal extra circuitry, the above discussed current measurement circuits can be modified to detect over current conditions. The current estimation method does not require any additional external components or specialized inductors. The method describe herein does not result in any significant loss in efficiency. This method is applicable to systems with either external power FETs or internal power FETs.

DESCRIPTION

Figure 1:
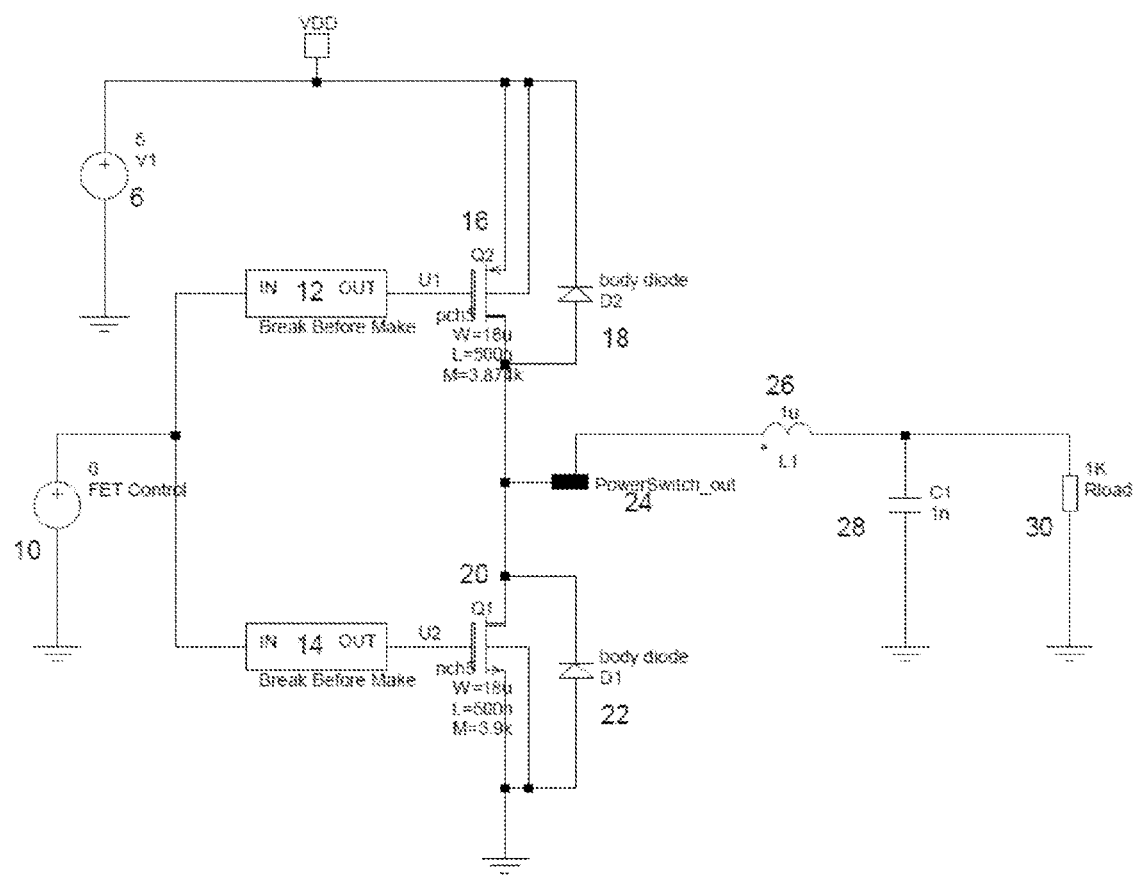
FIG. 1 shows a conventional BUCK regulator or converter.
Figure 2:
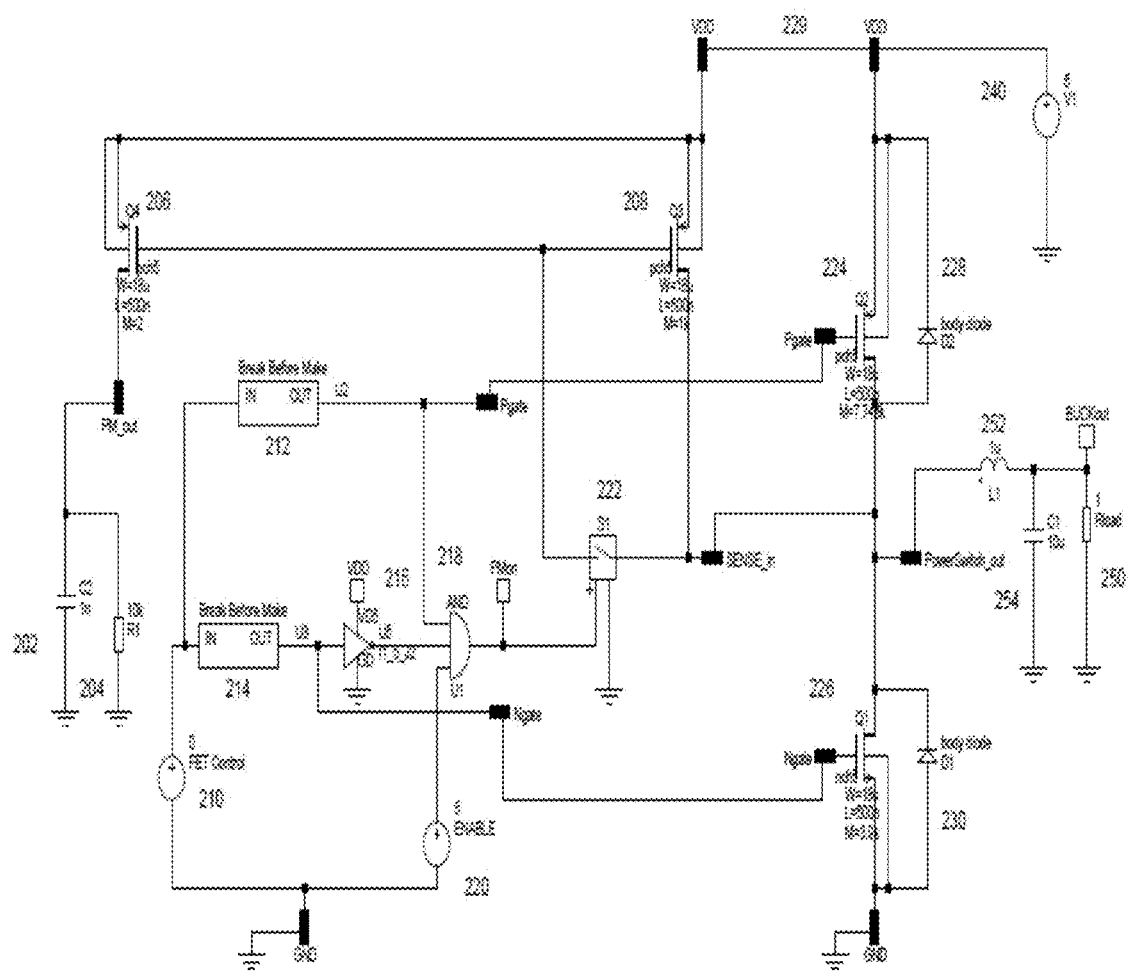
FIG. 2 shows an exemplary BUCK regulator with a first Current Measure Circuit.

FIG. 2 shows a first implementation of a current estimation circuit and power FET output stage. Similar to FIG. 1, FET control 210 drives BBMs 212 and 214 with outputs Pgate and Ngate, respectively. BBM 214 is connected to an invertor 216 which drives AND gate 218. ENABLE input 220 allows an external device to turn on or off AND gate 218. The output of AND gate 218 is PMon, which is supplied to idealized switch S1 222. Switch S1 222 receives a SENSE_in signal provided by FETs Q1 226 and Q2 224 in block 229. Components in block 229 can be integrated (internal) or off-chip (external). SENSE_in is also provided to Q3 276, while the output of S1 222 is connected to the terminals of both Q3 276 and Q4 206. The output of Q4 206 is a PM_out signal provided to external capacitor 202 and resistor 204. A supply voltage source V1 240 provides VDD to FETS 206, 208 and 224, among others. Pgate 208 is provided to Q2 224, while Ngate 209 is provided to Q1 226. Body diodes D1 230 and D2 228 are built into the output power FETs Q1 226 and Q2 224 as usual. SENSE_in signal is connected to the power switch output voltage PowerSwitch_out, which in turn is connected to inductor 254 in series and capacitor 254 and load 250 in parallel.

In one embodiment, all transistors of FIG. 2 are integrated on a monolithic chip, except Q1 226 and Q2 224 which could be "external" power FETs. In another embodiment, Q1 226 and Q2 224 are integrated on the same monolithic chip as the rest of the transistors. Idealized switch S1 222 is closed during the "dead time". AND gate U1 218 detects when both Q1 226 and Q2 224 power FETs are both off and asserts a logic HIGH level which turns on S1 222. With S1 222 closed, Q3 276 operates as a diode and supplies the entirety of the load current for inductor L1 252. When S1 222 is open, Q3 276 is off. Q3 276 is sized sufficiently large such that it is capable of sourcing this load current while operating in its "saturated" region. Because Q3 276 is operating in its saturated, high transconductance, region it only needs to be a fraction of the size of Q1 226 or Q2 224 to support the load current. Q1 226 and Q2 224 normally operate in their "resistive" region. If Q3 276 is sized to supply all the inductor current during the "dead time", body diode D1 230 will not turn on and the voltage at the PowerSwitch_out does not go below ground. When S1 is 222 closed, body diode D1 230 does not supply any inductor current in order to accurately measure the magnitude of the load current. Q4 206 is designed to be a fraction of the size of Q3 276 and will mirror a corresponding fraction of the current supplied by Q3 276. The current in Q3 276 and Q4 206 are current pulses whose magnitude is proportional to the load/inductor current. Filtering these current pulses (by external components C2 202 and R1 204) results in a DC voltage, at PM_out, which is proportional to the load/inductor current. Because R1 204 is an external resistor, it is not subject to process sheet resistance changes and thus provides an accurate means to convert the load/inductor current into a voltage.

When sourcing the load current, Q3 276 can dissipate a large amount of power because it is operating in its saturated region. For example, if Q3 276 is on for 40 ns every 1 us and supplies 3A of current during that time, assuming 5V across the drain source; then Q3 276 will dissipate (40 ns/1 us)*(3A)*(5V)=0.6 watts. However, there is no need for Q3 276 to conduct every 1 us. Even though the power FETs might be switching on and off every 1 us, Q3 276 only needs to sample the load current perhaps every 100 us or more. Thus in this example, Q3 276 would only dissipate 0.006 watts to make the current measurement. Furthermore, the system might only need the current estimation information once every second. Simulations show that a 40 ns sample every 1 us produces an accurate current measurement in about 30 us. Thus in this example the dissipated power is (30 us/1 second)*(3A)*(5v)=450 e-6 watts. In FIG. 2, the ENABLE control input 220 drives the U1 AND 218 gate. When ENABLE is low S1 222 is open and Q3 276 will not source current to the load. Thus by using the ENABLE signal, a system controller can turn on and off the current measurement and thereby prevent the current measurement from significantly degrading the efficiency of the regulator.

Figure 3:
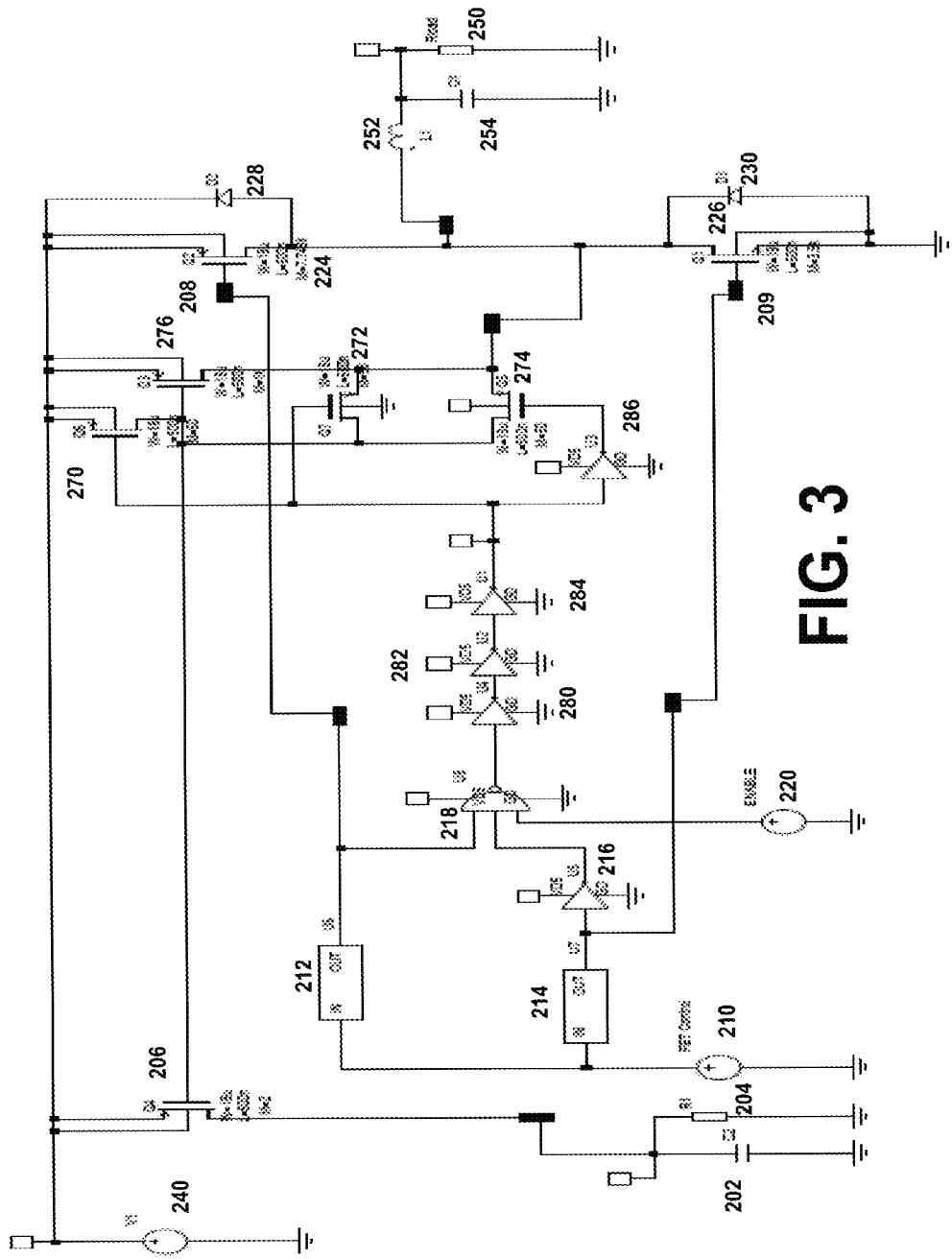
FIG. 3 shows an exemplary BUCK regulator with a second Current Measure Circuit.

FIG. 3 shows a second implementation of the circuit shown in FIG. 2. Here S1 222 of FIG. 2 is replaced by transmission FETs Q5 274 and Q7 272. Also shown is Q6 270 which is used to turn off Q3 276 when the ENABLE control is de-asserted. The inverters U4, U2 and U1 280, 282 and 284 increase the drive strength to control the current measure transistor gates of Q6 270 and Q7 272.

Figure 4:
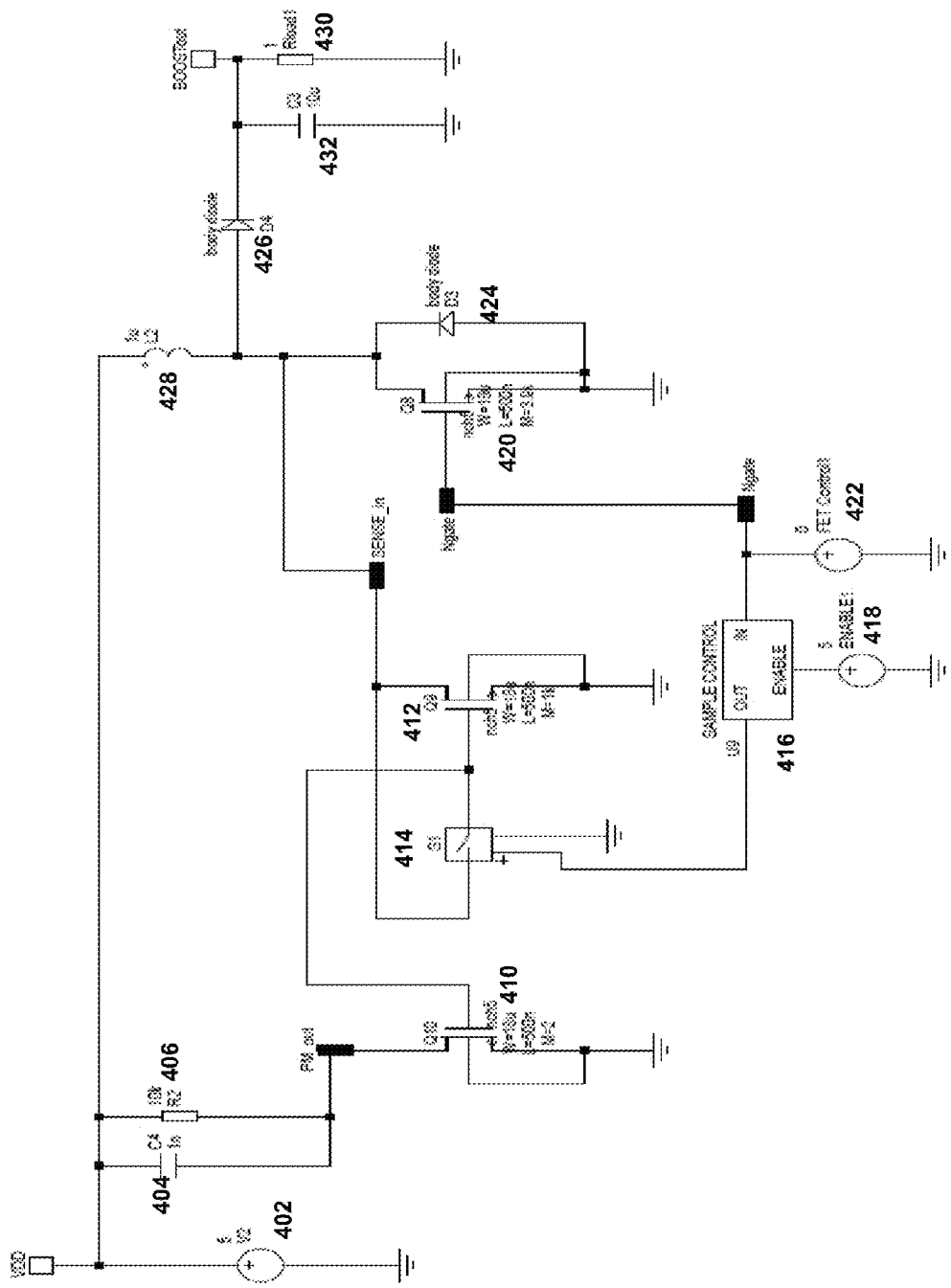
FIG. 4 shows one implementation of the current sense used in conjunction with a BOOST regulator.
Figure 5:
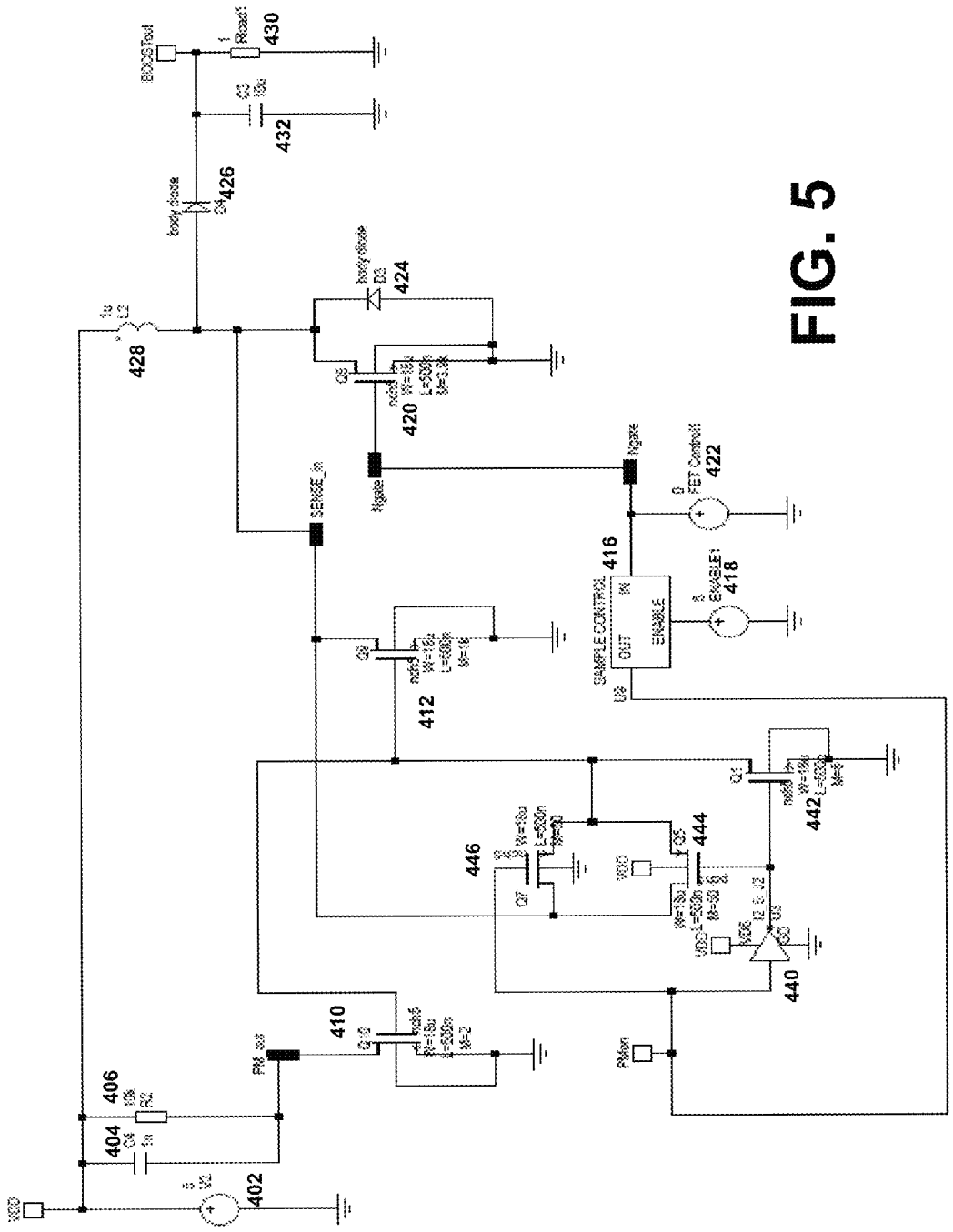
FIG. 5 is another implementation of the circuit shown in FIG. 4.

Next, FIGS. 4-5 show embodiments for Current Measurement with BOOST Regulator Topology. FIG. 4 shows a simplified implementation of the current sense used in conjunction with a BOOST regulator. The principal of operation of the current sense is similar to that of the BUCK regulator. Power FET Q8 420 is cycled on and off, establishing a voltage on the BOOSTout. Load current flows through inductor L2 428. The SAMPLE CONTROL block detects when Q8 420 is shut off as determined by the FET Control, and generates a pulse (20 ns wide in one implementation) that closes switch S1 414 for the duration of the pulse. When S1 414 is closed, Q9 412 acts as a diode conducting current in its saturated region of operation. With S1 414 open, Q9 412 is assumed to be off. As long as the drain of Q9 412 is held below the voltage required to turn on diode D4 426, all the inductor/load current will flow into Q9 412. Q10 410 mirrors a small fraction of Q9's current and generates a DC voltage across a filter with R2 406 and C4 404 at PM_out, which is proportional to the inductor/load current. In one embodiment, R2 406 is external to the monolithic integrated circuit to remove process sheet resistance variation on the PM_out voltage. ENABLE control 418 on SAMPLE CONTROL circuit 416 operates the current detector infrequently so as to minimize the power dissipation.

Q9 420 is sized such that the SENSE_in voltage is below the voltage necessary to turn on D4 426. This voltage is determined by the output voltage of the BOOST regulator (BOOSTout). Q9 412 needs to sized increasingly larger for lower BOOSTout voltages and for larger inductor/load currents. For most applications Q9 412 will be smaller than Q8 420 as it is operating in its high transconductance, saturated region, when conducting current.

FIG. 5 is a more detailed implementation of the circuit shown in FIG. 4. Here switch S1 414 of FIG. 4 is replaced with transmission FETs Q5 444 and Q7 446 and FET Q1 442 has been added to insure that Q9 412 is turned off (by pulling the gate of Q9 412 to ground) when the output of the SAMPLE CONTROL is a low logic level (i.e. not sampling). Q8 420 need not be integrated on the same monolithic integrated circuit as the rest of the FETs.

The use of Current Measure for Over Current Detection will be discussed next. Quickly detecting and protecting against large load currents is important in order to prevent destruction of components. Large load currents might result, for example, if the regulator load is shorted. With minimal extra circuitry, the above discussed current measurement circuits can be modified to detect over current conditions.

Figure 6:
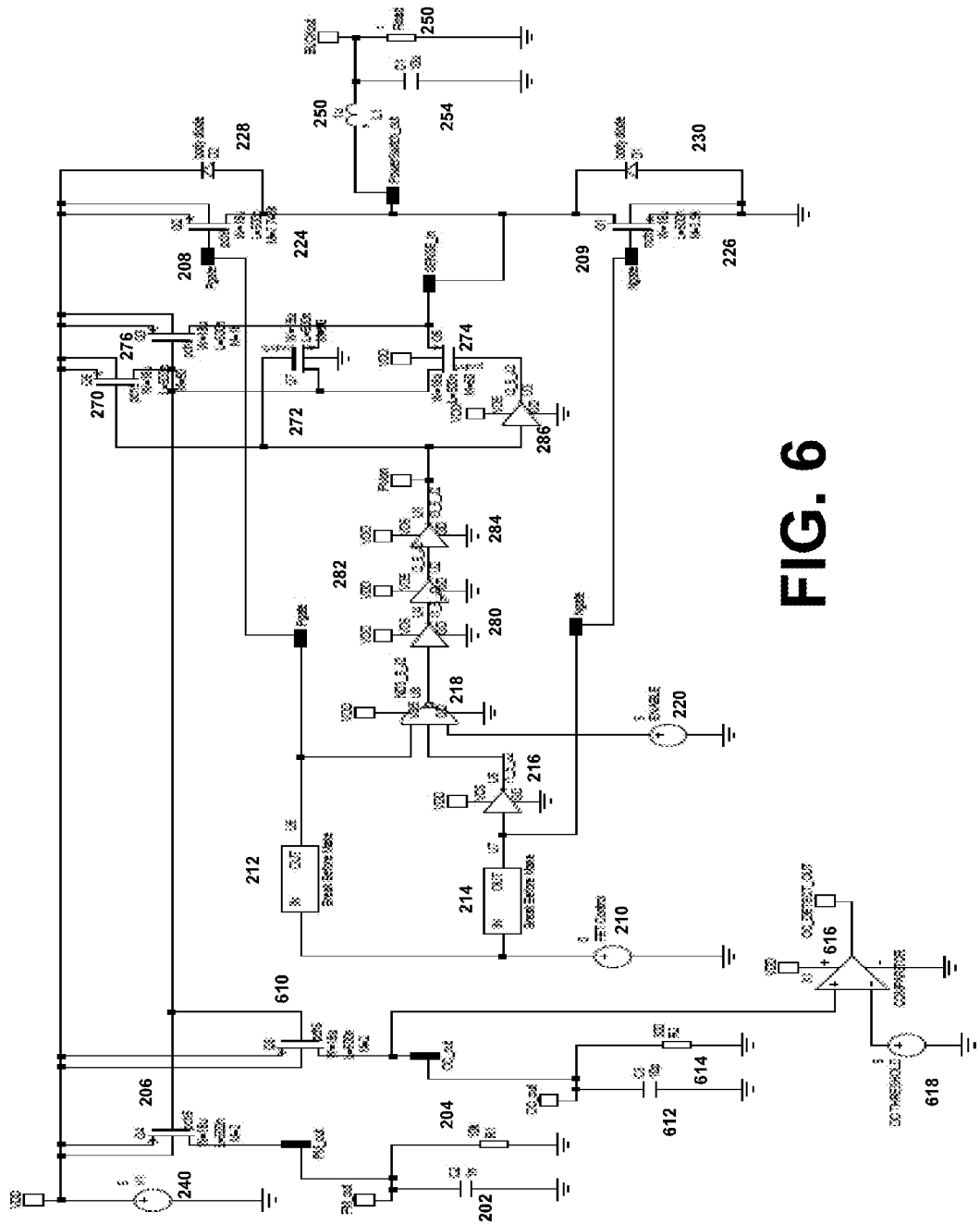
FIG. 6 shows one embodiment with modifications to the circuit of FIG. 3 to allow for over current detection (OC detection).

FIG. 6 shows one embodiment with modifications to the circuit of FIG. 3 to allow for over current detection (OC detection) with the addition of Q8 610, C3 612, R2 614, COMPARATOR 616 and OC_THRESHOLD 618. As previously discussed, when Q3 276 is on, it sources the current in the inductor 250. This current is scaled by the ratio of the size of Q3 276 to Q4 206 and Q8 610. Thus a scaled version of the inductor current is sourced to C3 612 and R2 614 which convert the current into a voltage. However, for over current detection the RC time constant of R2 614 and C3 612 can be shorter than the RC time constant of R1 204 and C2 202. The shorter RC time constant allows for faster detection of an over current condition.

Figure 7:
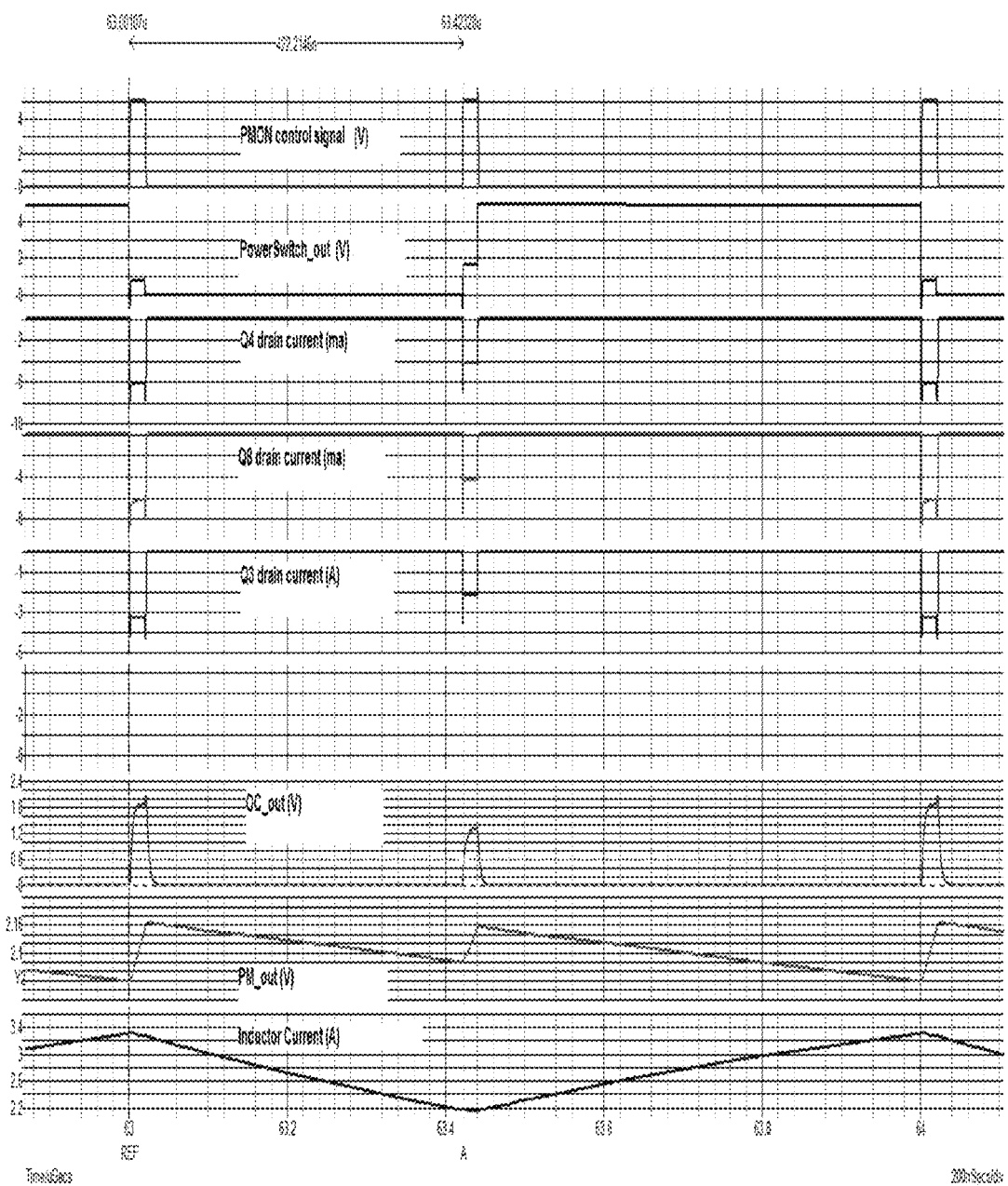
FIG. 7 shows exemplary waveforms from the circuit shown in FIG. 6.

FIG. 7 shows exemplary waveforms from the circuit shown in FIG. 6. The shape of the OC_out voltage is able nearly to track the shape of the Q8 610 drain current pulse. This is in contrast to the shape of the PM_out signal which is a highly filtered response to the Q4 206 drain current. The small amount of filtering on the OC_out signal (from C3 614) serves to remove fast voltage spikes at the transition edges. The PowerSwitch_out waveform shows that during the time that Q3 276 drain is conducting current (i.e. when PMON control signal is asserted HIGH), body diode D1 is not turned on (as the PowerSwitch_out voltage does not go below ground). As such, the drain current in Q3 276 accurately reflects the Inductor Current. Notice that the inductor current is a triangle wave and that the Q3 276 drain current accurately captures the difference in amplitude of this triangle wave. The PM_out is the average of the Q4 206 drain current pulses and is proportional to the average current in the inductor. The OC_out is proportional to the instantaneous current in the inductor and thus displays different voltage amplitudes, tracking the inductor current triangle waveform. The average inductor current for the waveform shown in FIG. 7 is approximately 2.75 A. If the OC_THRESHOLD voltage 618 is set to about 2V then inductor currents greater than 2.75 A will cause the comparator OC_DETECT_OUT to go HIGH, flagging an over current condition. Once an over current condition is detected, the FET Control 210 circuitry can be instructed to de-activate the power FET switching and turn off the power FETs. Turning off the power FETs in response to an over current condition will protect the circuits. The PM_out signal could also be used for detecting the over current condition, however, its response time is much slower due to the larger amount of filtering on this output. The over current threshold can either be adjusted by changing the OC_THRESHOLD 618 voltage or the value of R2 614. It is important to note that Q3 276 only needs to be able to support currents up to the over current threshold (i.e. when Q3 276 is on it must be able to hold off the conduction of the body diode D1 230).

Figure 8:
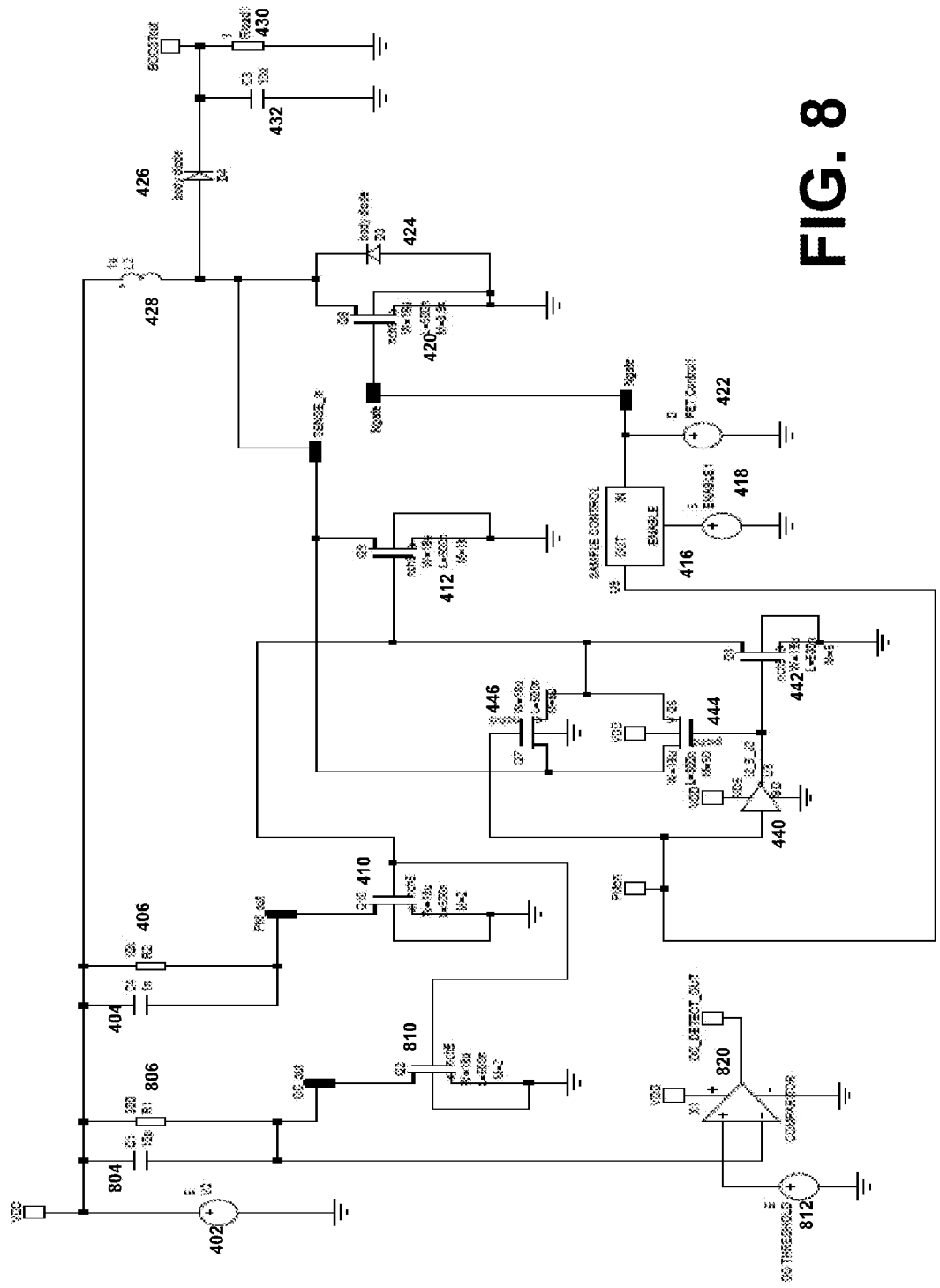
FIG. 8 shows one embodiment with modifications to the circuit of FIG. 5 to allow for OC detection.

Adding over current detection to the BOOST regulator of FIG. 5 is done in a similar manner to the BUCK regulator as shown in FIG. 8. In FIG. 8, a filter with C1 804 and R1 806 is connected to VDD to form OC_out terminal. Here the negative terminal of the comparator is connected to the OC_out terminal as the current pulses sourced by Q2 810 pull the voltage at the OC_out towards ground. Thus when the OC_out voltage falls below the OC_THRESHOLD the OC_DETECT_OUT is asserted HIGH indicating an over current condition.

Figure 9:
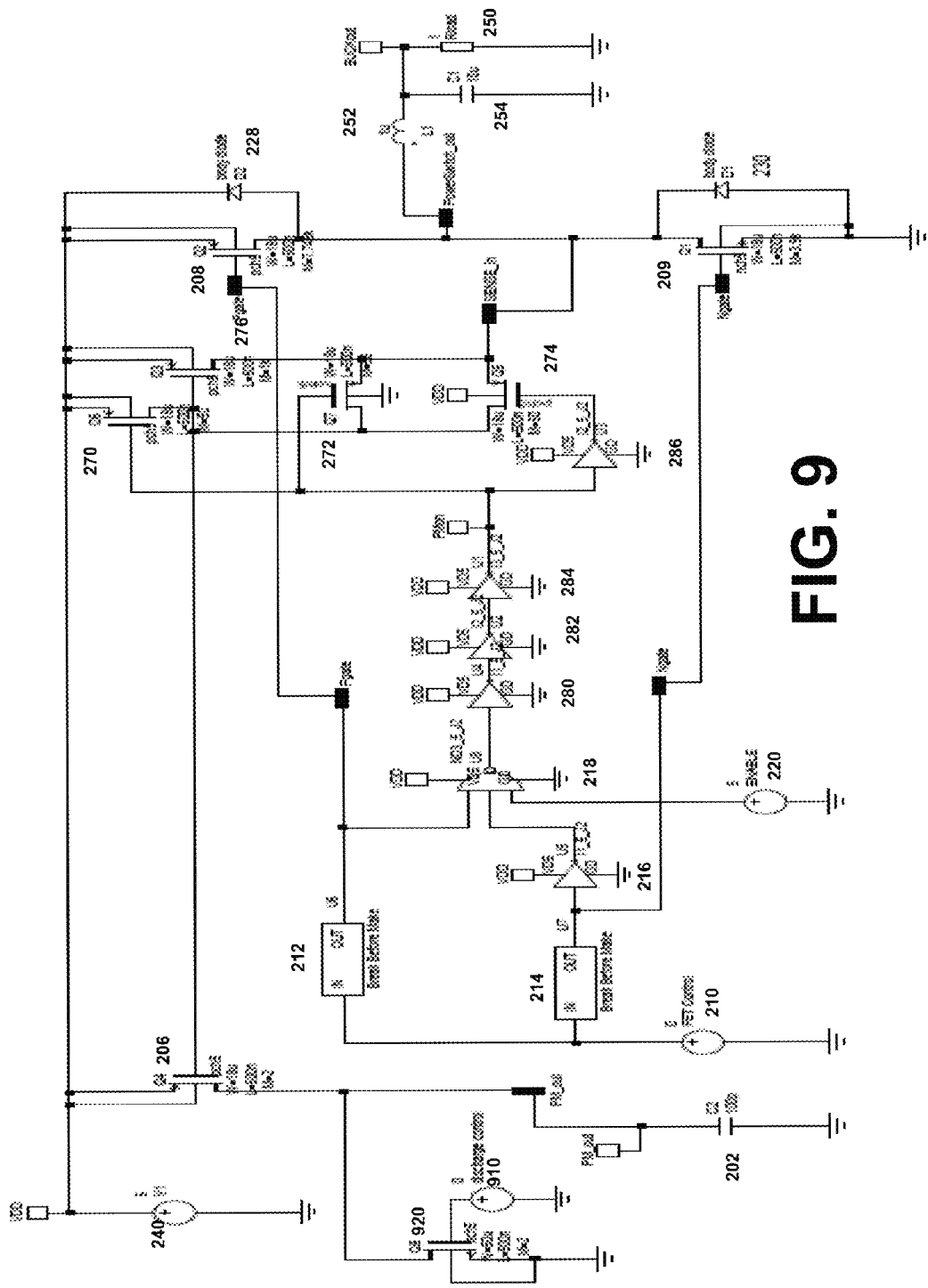
FIG. 9 shows an embodiment similar to FIG. 3 without requiring an external resistor.

The above implementations convert the pulsed load current, detected during the power FET dead time, into a voltage via an external resistor, while using an external filter capacitor to convert the transient voltage pulses to a DC voltage. FIG. 9 shows an alternative implementation which eliminates the external resistor 204, utilizing only the capacitor C2 202. FET Q8 920 is connected to a discharge control 910 and the output of Q8 is connected to C2 202 to generate PM_out.

The circuit in FIG. 9 operates in a similar manner as the circuit shown in FIG. 3. Initially the "discharge control" pulses high the gate of Q8 920, turning Q8 920 on and discharging C2 202. The "ENABLE" signal is timed to only allow the PMon signal to go high for a small number of break before make pulses. The load current mirrored in Q4 206 charges the capacitor C2 202 as given by the known formula:

$$I = C(dV/dt)$$

Where I=the current charging C2
C=the value of capacitor C2
dV=the change in voltage on C2
dt=the amount of time current is flowing into C2

Figure 10:
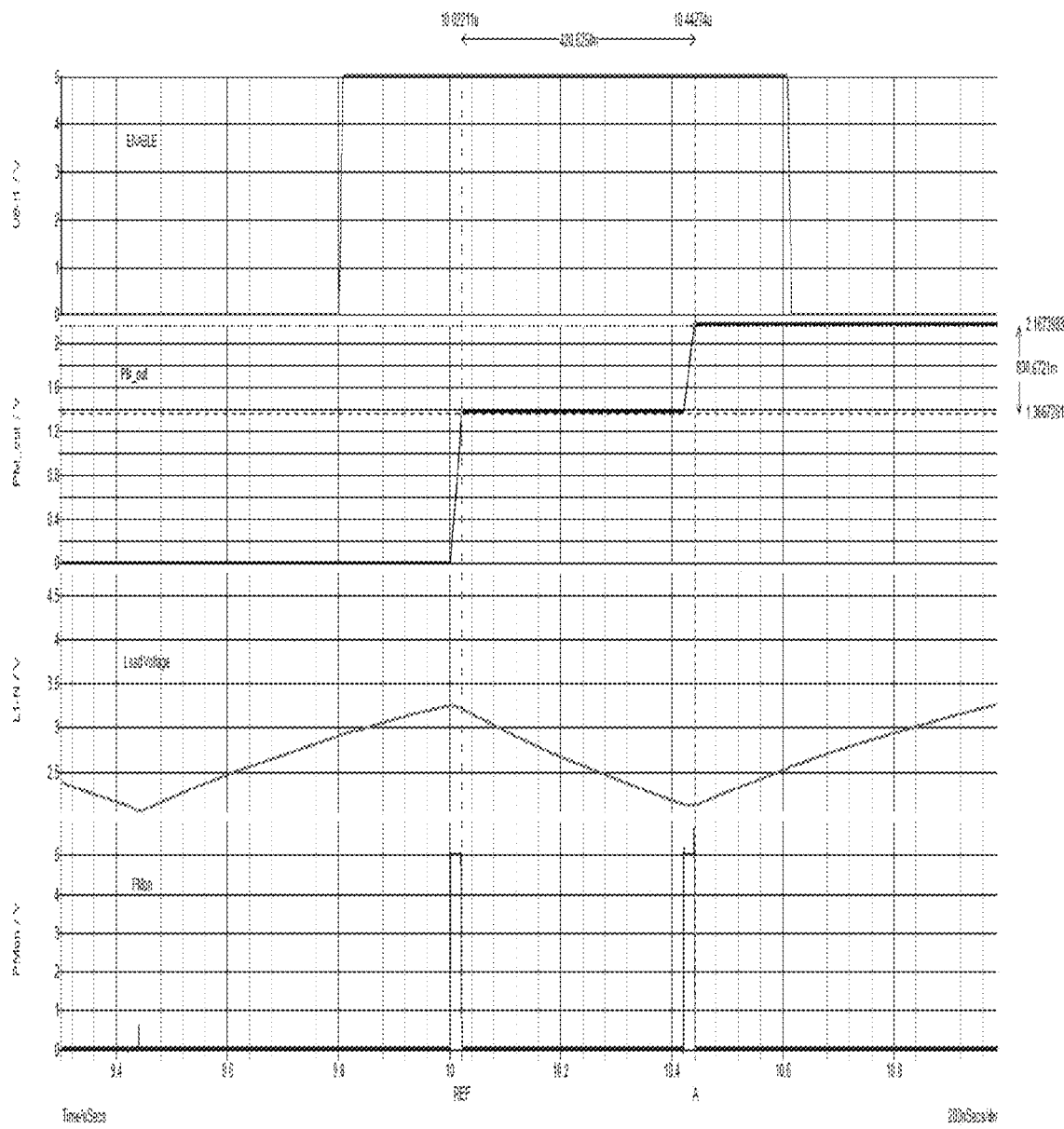
FIG. 10 shows exemplary waveforms from the circuit shown in FIG. 9.

FIG. 10 shows exemplary waveforms for the circuit shown in FIG. 9. In FIG. 10 the ENABLE signal only allows two of the "dead time" pulses though to the PM_out. These PM_out pulses turn on Q5 274 and Q7 272 which in turn enable a fraction of the current in the load to mirror into Q4 206. The Q4 206 current charges C2 202 thereby increasing the voltage at the PM_out at each "dead time" pulse. After the ENABLE 220 goes low, the voltage on C2 202 is given by equation #1 where all the terms are known except "I", which is then calculated. Once "I" is calculated it must be scaled by the ratio of the area of Q3 276 to Q4 206 to determine the load current in Rload 250. Note that two "dead time" pulses are used to charge C2 202, one pulse starting at the positive peak of the "Load Voltage" and another at the negative peak of the "Load Voltage". The current in the load is slightly different for these two pulses and by utilizing both pulses the average load current is more nearly determined. If Q3 276 is only turned on for a small number of pulses, it will not dissipate significant power. Thus relative to the circuit shown in FIG. 3, the implementation shown in FIG. 9 will dissipate less power.

Although the examples given above describe load estimation circuits for power supplies, one skilled in the art will appreciate that the technique can be applied to other circuit functions for operation in similar fashion. It will be understood from the foregoing description that various modifications and changes may be made in the preferred and alternative embodiments of the present invention without departing from its true spirit. For example, the FETs may be implemented using MOS transistors, bipolar transistors, or other suitable switching devices, the circuit may include a subset or superset of the elements described in the examples above, the method may be performed in a different sequence, the components provided may be integrated or separate, the devices included herein may be manually and/or automatically activated to perform the desired operation.

This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. A power regulator, comprising:
   a. an output power circuit having a plurality of dead time periods;
   b. a load current detector coupled to the output power circuit to measure a load current of the output power circuit during the dead time periods;
   c. a current mirror; and
   d. a controller to turn off the output power circuit during the dead time periods, wherein the controller turns on and off current measurement to prevent current measurement from degrading the efficiency of the power regulator and the current mirror is active to supply an output current being proportional to the detected load current of the power regulator.

2. The power regulator of claim 1, wherein the controller comprises first and second break before make (BBM) circuits.

3. The power regulator of claim 2, comprising first and second power transistors coupled to the first and second BBM circuits, respectively.

4. The power regulator of claim 3, comprising a logic circuit coupled to the BBM circuits to detect when the first and second power transistors are off.

5. The power regulator of claim 4, comprising a switch coupled to the logic circuit and the output power circuit to enable power measurement during the dead time periods.

6. The power regulator of claim 1, comprising a power output switching circuit coupled to the controller.

7. The power regulator of claim 1, comprising a current mirror circuit coupled to the output power circuit.

8. The power regulator of claim 7, wherein the current mirror circuit comprises a third transistor coupled to the output power circuit and a fourth transistor coupled to the third transistor, wherein the fourth transistor is a fraction of the size of the third transistor.

9. The power regulator of claim 7, comprising a filter coupled to the current mirror circuit.

10. The power regulator of claim 1, wherein the load current detector is in an integrated circuit and wherein the output power circuit comprises one or more power transistors internal to the integrated circuit.

11. The power regulator of claim 1, wherein the load current detector is in an integrated circuit and wherein the output power circuit comprises one or more power transistors external to the integrated circuit.

12. The power regulator of claim 1, wherein the load current detector measures an inductive current on a periodic basis to maintain high switching regulator efficiency.

13. The power regulator of claim 1, wherein the controller comprises first and second break before make (BBM) circuits, comprising
   a. first and second power transistors coupled to the first and second BBM circuits, respectively;
   b. a logic circuit coupled to the BBM circuits to detect when the first and second power transistors are off;
   c. a switch coupled to the logic circuit and the output power circuit to enable power measurement during the dead time periods;
   d. a current mirror circuit, comprising:
      i. a third transistor coupled to the output power circuit and
      ii. a fourth transistor coupled to the third transistor, wherein the fourth transistor is a fraction of the size of the third transistor; and
   e. a filter coupled to the current mirror circuit.

14. The power regulator of claim 1, comprising an inductor and wherein the load current detector measures an inductor current for a period of time and a scaled version of the inductor current to generate a voltage proportional to the inductor current.

15. The power regulator of claim 1, comprising a circuit coupled to the load current detector to provide over current detection and protection.

16. A method to detect a load current in a power regulator, comprising:
   a. providing power output through power transistors each having a plurality of dead time periods during break-before-make (BBM) of the power transistors; and
   b. measuring the load current of the output power circuit during the dead time period; and
   c. turning on and off current measurement by a controller to prevent current measurement from significantly degrading the efficiency of the power regulator and making active a current mirror to supply an output current being proportional to the detected load current of the power regulator.

17. The method of claim 16, comprising measuring the load current in an integrated circuit with one or more power transistors external to the integrated circuit.

18. The method of claim 16, comprising measuring current on a periodic basis to maintain high switching regulator efficiency.

19. The method of claim 16, comprising detecting an inductor current for a period of time and a scaled version of the inductor current to generate a voltage proportional to the inductor current.

20. The method of claim 16, comprising providing over current detection and protection.

* * * * *